(12) United States Patent
Jin et al.

(10) Patent No.: US 7,453,097 B2
(45) Date of Patent: Nov. 18, 2008

(54) NANOWIRE LIGHT EMITTING DEVICE AND METHOD OF FABRICATING THE SAME

(75) Inventors: Young-gu Jin, Hwaseong-si (KR);
Sung-hoon Lee, Yongin-si (KR);
Hyo-sug Lee, Suwon-si (KR);
Byoung-lyong Choi, Seoul (KR);
Jong-seob Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 300 days.

(21) Appl. No.: 11/100,376

(22) Filed: Apr. 7, 2005

(65) Prior Publication Data

US 2005/0224790 A1    Oct. 13, 2005

(30) Foreign Application Priority Data

Apr. 7, 2004    (KR) .................... 10-2004-0023803

(51) Int. Cl.
*H01L 33/00* (2006.01)
*H01L 51/50* (2006.01)

(52) U.S. Cl. .................. 257/88; 257/40; 257/E51.026; 438/82; 438/99

(58) Field of Classification Search ................... 257/13, 257/28, 40, 79, 88, 94, 96–97, E51.012–E51.023, 257/E51.026; 438/82, 99
See application file for complete search history.

(56) References Cited

U.S. PATENT DOCUMENTS

| | | | | |
|---|---|---|---|---|
| 3,971,870 | A * | 7/1976 | Christensen et al. | 428/336 |
| 5,332,910 | A * | 7/1994 | Haraguchi et al. | 257/13 |
| 7,254,151 | B2 * | 8/2007 | Lieber et al. | 372/44.01 |
| 2002/0175408 | A1 * | 11/2002 | Majumdar et al. | 257/734 |
| 2003/0168964 | A1 * | 9/2003 | Chen | 313/495 |
| 2004/0003839 | A1 * | 1/2004 | Curtin | 136/250 |
| 2004/0105810 | A1 * | 6/2004 | Ren et al. | 423/624 |
| 2005/0006673 | A1 * | 1/2005 | Samuelson et al. | 257/232 |
| 2005/0224780 | A1 * | 10/2005 | Jin et al. | 257/13 |

(Continued)

FOREIGN PATENT DOCUMENTS

CN    1447629 A    10/2003

(Continued)

OTHER PUBLICATIONS

Ng, Kwok K. Complete Guide to Semiconductor Devices. 2nd. Ed. Wiley-Interscience: New York. (2002): pp. 405-406.*

(Continued)

*Primary Examiner*—Douglas M. Menz
*Assistant Examiner*—Matthew W Such
(74) *Attorney, Agent, or Firm*—Sughrue Mion, PLLC

(57) ABSTRACT

A nanowire light emitting device and a method of fabricating the same are provided. The nanowire light emitting device includes a first conductive layer on a substrate, a plurality of nanowires on the first conductive layer, each nanowire having a p-type doped portion and an n-type doped portion on both ends, a light emitting layer between the p-type doped portion and n-type doped portion, and a second conductive layer formed on the nanowires. The doped portions are formed by adsorbing molecules around a circumference thereof.

7 Claims, 4 Drawing Sheets

U.S. PATENT DOCUMENTS

2005/0227391 A1* 10/2005 Jin et al. .................. 438/22
2006/0207647 A1* 9/2006 Tsakalakos et al. ......... 136/256

FOREIGN PATENT DOCUMENTS

| CN | 1453884 A | 11/2003 |
|---|---|---|
| JP | 6-260721 A | 9/1994 |

OTHER PUBLICATIONS

Nollau, A., et al. "Controlled n-Type Doping of a Molecular Organic Semiconductor: Naphthalenetetracarboxylic dianhydride (NTCDA) Doped With Bis(ethylenedithio)-tetrathiafulvalene (BEDT-TTF)." J. Appl. Phys. vol. 87 (2000): pp. 4340-4343.*

Guk, E.G., et al. "Dopant Impurity Diffusion From Polymer Diffusants and its Applications in Semiconductor Device Technology. A Review." Semiconductors. vol. 33 (1999): pp. 265-275.*

* cited by examiner

NANOWIRE LIGHT EMITTING DEVICE AND METHOD OF FABRICATING THE SAME

This application claims priority from Korean Patent Application No. 10-2004-0023803, filed on Apr. 7, 2004, in the Korean Intellectual Property Office, the disclosure of which is incorporated herein in its entirety by reference.

BACKGROUND OF THE INVENTION

1. Field of the Invention

The present invention relates to a nanowire light emitting device and a method of fabricating the same, and more particularly, to a nanowire light emitting device producible at a low manufacturing cost and which can be used for forming a large size device and a method of fabricating the nanowire light emitting device.

2. Description of the Related Art

A light emitting diode (LED) using gallium nitride (GaN) is used as a light emitting device. Although the GaN-based LED has high light emitting efficiency, it has a mismatch problem with a substrate, thus making it difficult to be used for producing a large size device.

Technologies using nanostructures for light emitting devices are being developed. Japanese Patent Laid-Open Publication No. Hei 10-326888 discloses a light emitting device comprising a nanowire made of silicon and a method of fabricating the light emitting device. After a catalytic layer such as gold is deposited on a substrate, the silicon nanowire is grown from the catalytic layer by flowing silicon tetrachloride ($SiCl_4$) gas into a reactor. The silicon nanowire light emitting device, however, has a low light emitting efficiency while being manufactured at a low cost.

U.S. patent Publication No. 2003/0168964 discloses a nanowire light emitting device having a p-n diode structure. In this case, the lower portion of the nanowire light emitting device is formed of an n-type nanowire and the upper portion is formed of a p-type nanowire, and the nanowire light emitting device emits light from the junction region of the two portions. Other components are added using a vapor phase-liquid phase-solid phase (VLS) method in order to fabricate a nanowire light emitting device having the p-n junction structure.

As the nanowire light emitting device having the p-n junction structure is grown on a catalytic layer, the n-type nanowire and the p-type nanowire are sequentially formed, thus making it difficult to obtain a high quality p-n junction structure.

SUMMARY OF THE INVENTION

The present invention provides a light emitting device having a nanowire structure in which p-type and n-type doped portions of the nanowire are clearly divided by adsorbing doping materials on the surface of the nanowire and a method of fabricating the light emitting device.

According to an aspect of the present invention, there is provided a nanowire light emitting device comprising: a substrate; a first conductive layer formed on the substrate; a plurality of nanowires vertically formed on the first conductive layer, each nanowire having a p-type doped portion and an n-type doped portion separately; a light emitting layer between the p-type doped portion and the n-type doped portion; and a second conductive layer formed on the nanowires, wherein at least one of the p-type doped portion and the n-type doped portion are formed by adsorbing molecules around a corresponding circumference of the nanowires.

The nanowire light emitting device may further comprise an insulating polymer filling a space between the nanowires on the first conductive layer. The light emitting layer may be a boundary surface between the p-type doped portion and the n-type doped portion. The light emitting layer may be an undoped intrinsic portion interposed between the p-type doped portion and the n-type doped portion.

The p-type doped portion may be a portion where molecules having a high electron affinity are adsorbed around a circumference thereof. The molecules having a high electron affinity may contain fluorine. The molecules containing fluorine may be tetrafluoro-tetracyano-quinodimethane (F4-TCNQ) molecules.

The n-type doped portion may be a portion where molecules having a low ionization potential are adsorbed around a circumference thereof. The molecules having a low ionization potential may be molecules containing at least one metal selected from the group consisting of lithium, copper, and zinc, or organic molecules. The molecules may be at least one selected from the group consisting of copper phthalocyanine (CuPc), zinc phthalocyanine (ZnPc), pentacene, and bis(ethylenddithio)tetrathiafulvalene (BEDT-TTF).

The nanowire may be formed of ZnO.

According to another aspect of the present invention, there is provided a method of fabricating a nanowire light emitting device, the method comprising: forming a first electrode layer on a substrate; forming a plurality of nanowires vertically on the first electrode layer; p-doping or n-doping a lower portion of the nanowires; n-doping or p-doping an upper portion of the nanowires with a different polarity from that of the lower portion of the nanowires; and forming a second electrode layer on the nanowires.

The p-doping or n-doping of the lower portion of the nanowires may comprise: adsorbing molecules having a high electric affinity or a low ionization potential around a circumference of the nanowires; filling a first insulating polymer between the nanowires on the first electrode layer; and removing the molecules adsorbed on the upper portion of the nanowires by etching the first insulating polymer corresponding to the upper portion of the nanowires.

The n-doping or p-doping of the upper portion of the nanowires with a different polarity from that of the lower portion of the nanowires may comprise adsorbing molecules having a high electric affinity or a low ionization potential so that the different polarity portion is doped around the circumference of the nanowires exposed on the lower portion of the nanowires.

The n-doping or p-doping of the upper portion of the nanowires may comprise: forming an undoped intrinsic portion of the nanowires with a predetermined height on the resultant of the p-doping or n-doping of the lower portion of the nanowires; and adsorbing molecules having a high electric affinity or a low ionization potential so that the different polarity portion is doped around the circumference of the nanowires exposed on the intrinsic portion. In this case, the forming of the intrinsic portion may comprise: forming a second insulating polymer covering the nanowires exposed on the resultant of the p-doping or n-doping of the lower portion of the nanowires; and etching the second insulating polymer to form the intrinsic portion on the upper portion of the nanowires to a predetermined height.

The forming of the second electrode layer on the nanowires may comprise: etching the third insulating polymer to expose edges of the nanowires; and forming a second conductive layer on the third insulating polymer.

DETAILED DESCRIPTION OF THE INVENTION

A nanowire light emitting device and a method of fabricating the same according to the present invention will become more apparent by describing in detail exemplary embodiments thereof with reference to the attached drawings.

Figure 1:
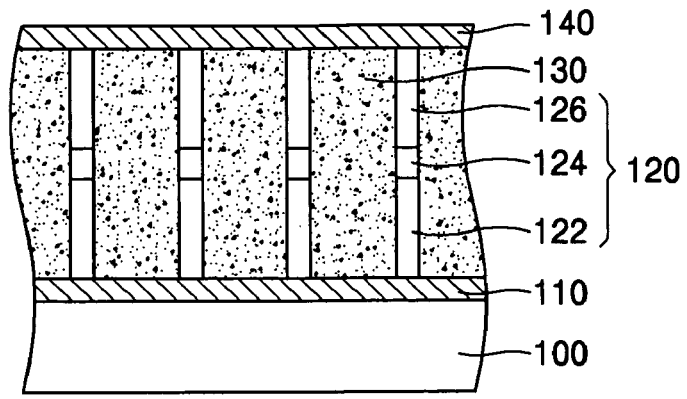
FIG. 1 is a cross-sectional view of a nanowire light emitting device according to a first exemplary embodiment of the present invention.

FIG. 1 is a cross-sectional view of a nanowire light emitting device according to a first exemplary embodiment of the present invention.

Referring to FIG. 1, a conductive layer (a first electrode layer) 110 is formed on a substrate 100 and a plurality of nanowires 120 are vertically formed on the conductive layer 110. An insulating polymer 130 is filled in a space between the nanowires 120. An electrode layer (a second electrode layer) 140 is formed on the nanowires 120.

The nanowires 120 are composed of a p-type doped portion 122, an n-type doped portion 126, and an intrinsic portion 124, being a light emitting layer between the p-type doped portion 122 and the n-type doped portion 126. The intrinsic portion is not doped.

The substrate 100 may be formed of a silicon wafer, a sapphire wafer, or a flat metal film.

The first electrode layer 110 may be composed of aluminum, gold, or magnesium. The second electrode layer 140 may be formed as a transparent electrode layer, for example, an ITO or a p-type doped GaN layer.

The nanowires 120 may be formed of ZnO, GaN, GaAs, InGaN, CdS, or Si. The light emitted from the light emitting device varies according to the material of the nanowires 120. When the nanowires are formed of ZnO, ultraviolet rays are emitted. When the nanowires are formed of Si, infrared rays are emitted. When the nanowires are formed of GaN, ultraviolet rays or blue light are emitted. When the nanowires are formed of InGaN, blue light is emitted. When the nanowires are formed CdS, green light is emitted. When the nanowires are formed of GaAs, red light is emitted. The nanowires may be formed to have a diameter of 20-100 nm and a length of 1 µm.

The nanowires have a p-i-n junction structure formed of a p-doped portion 122, an n-doped portion 126, and an intrinsic portion 124.

The p-type doped portion 122 is a portion in which a p-type doping material is adsorbed around the circumference of the nanowires 120. A molecule having a high electron affinity such as tetrafluoro-tetracyano-quinodimethane (F4-TCNQ), being an electron acceptor molecule, may be used as the p-type doping material. Because the p-type doping material takes away electrons from the surface of the corresponding nanowires 120, holes are formed on the surface of the portion where the p-type doping material is adsorbed. Thus, the portion becomes the p-type doped portion 122.

The n-type doped portion 126 is a portion in which an n-type doping material is adsorbed around the circumference of the nanowires 120. A molecule having a low ionization potential such as an electron donor molecule containing at least one of lithium, zinc, and metal may be used as the n-type doping material. For example, copper phthalocyanine (CuPc), zinc phthalocyanine (ZnPc), pentacene, and bis(ethylenddithio)tetrathiafulvalene (BEDT-TTF) may be used. Because the n-type doping material provides electrons to the surface of the corresponding nanowires 120, free electrons are formed on the surface of the portion where the n-type doping material is adsorbed. Thus, the portion becomes the n-type doped portion 126.

The insulating polymer 130 prevents an electronic contact between the nanowires 120. A photoresist may be used as the insulating polymer 130.

The operation of a light emitting device having the above structure will be described with reference to the attached drawings.

First, the holes of the p-type doped portion 122 and the electrons of the n-type doped portion 126 are reunited in the intrinsic portion 124 when a positive voltage is applied to the first electrode layer 110 connected with the p-type doped portion 122 of the nanowires 120 and a negative voltage is applied to the second electrode layer 140 connected with the n-type doped portion 126 of the nanowires 120, thus emitting light. The light emitted from the intrinsic portion 124 passes through a transparent electrode layer such as the second electrode layer 140 and is emitted to the outside.

The exemplary embodiment describes that both the p-type doped portion and the n-type doped portion are doped by adsorption of molecules. However, one of the doped portions may be doped by adsorption and the other portion may be doped by conventional ion implantation.

Figure 2:
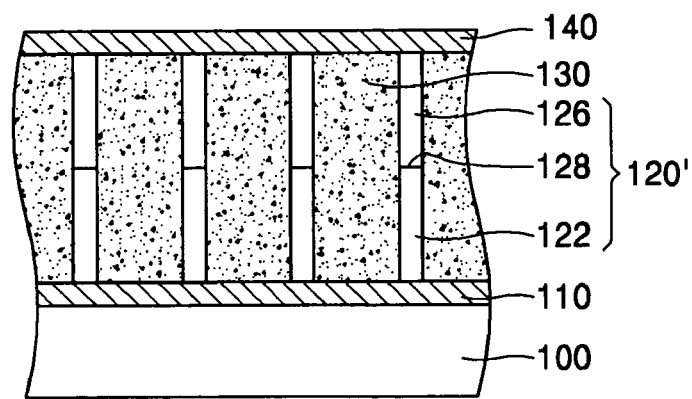
FIG. 2 is a cross-sectional view of a nanowire light emitting device according to a second exemplary embodiment of the present invention.

FIG. 2 is a cross-sectional view of a nanowire light emitting device according to a second exemplary embodiment of the present invention.

Referring to FIG. 2, a conductive layer (a first electrode layer) 110 is formed on a substrate 100 and a plurality of nanowires 120' are vertically formed on the conductive layer 110. An insulating polymer 130 is filled in a space between the nanowires 120'. An electrode layer (a second electrode layer) 140 is formed on the nanowires 120'.

A p-type doped portion 122 and an n-type doped portion 126 are formed in contact with each other in the nanowires 120', and a boundary surface between the p-type doped portion 122 and the n-type portion 126 forms a light emitting layer 128. Such a light emitting structure forms a p-n junction structure in comparison to the p-i-n junction structure of the first exemplary embodiment.

In a light emitting device having the above structure, light is emitted from the light emitting layer 128 when a direct current passes through both ends of the nanowires 120'.

FIG. 3 through FIG. 10 are diagrams illustrating a method of fabricating a nanowire light emitting device according to the first exemplary embodiment of the present invention.

Figure 3:
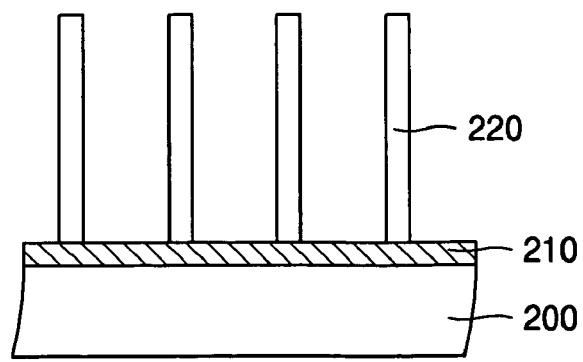
FIG. 3 through FIG. 10 are cross-sectional views illustrating a method of fabricating a nanowire light emitting device according to the first exemplary embodiment of the present invention.

Referring to FIG. 3, a conductive layer 210 such as an aluminum layer is deposited on a substrate 200. A plurality of nanowires 220 are formed to have a length of 1 µm on the aluminum layer 210 by a metal-organic-vapor phase epitaxy (MOVPE) method. The nanowires 220 may be fabricated of ZnO using diethyl-zinc (DEZn) and oxygen as a reacting source. However, the method of fabricating the nanowires 220 is not limited to the above method, and a conventional vapor phase-liquid phase-solid phase (VLS) method, a self-assembly method, and a method using a metal catalytic layer may also be used.

Figure 4:
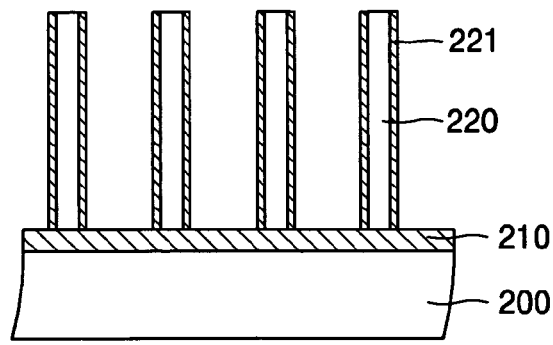

Referring to FIG. 4, a p-type doping material 221 having a high electron affinity such as a F4-TCNQ molecule is doped on a circumference of the nanowires 220. The p doping material 221 takes away electrons from a surface of the nanowires 220 while being adsorbed on the circumference of the nanowires 220. As a result, the nanowires 220 is p-doped.

Figure 5:
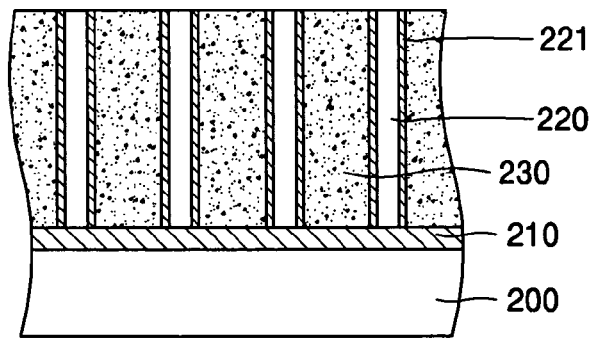

Referring to FIG. 5, an insulating high molecule such as a thin photoresist 230 is spin-coated and then fills a space between the p-doped nanowires 220 on the first conductive layer 210.

Figure 6:
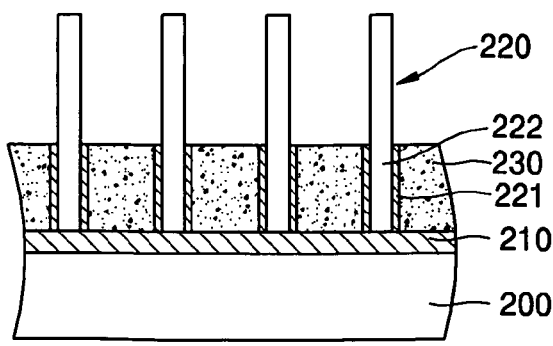

Referring to FIG. 6, the photoresist 230 and a portion of the p-type doping material 221 are removed by wet etching the photoresist 230 located in the upper portion of the nanowires 220 or by oxygen plasma of the photoresist 230 located in the upper portion of the nanowires 220. The portion of the nanowires in which the remained p-type doping material 221 is formed becomes a p-type doped portion 222.

Figure 7:
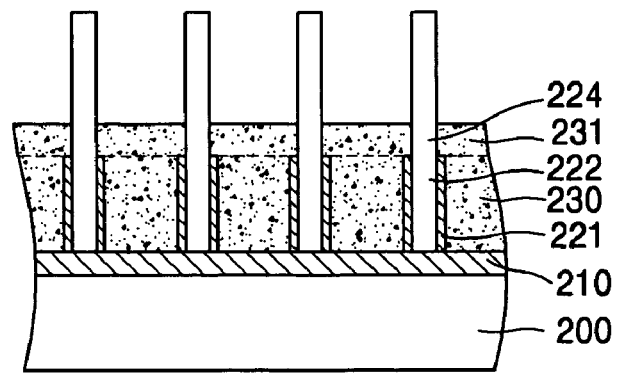

Referring to FIG. 7, a thin photoresist 231 is spin-coated on the upper portion of the p-doped portion 222 and then fills the space between the nanowires 220. Then, the photoresist 231 is selectively removed by wet etching or oxygen plasma. Thus the photoresist 231 having a predetermined height is formed on the photoresist 230. The portion of the nanowires covered with the photoresist 231 is not a doped region and forms an intrinsic portion 224.

Figure 8:
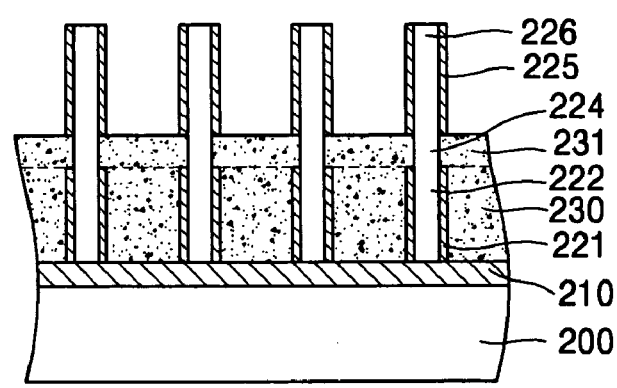

Referring to FIG. 8, an n-type doping material 225 is adsorbed on the circumference of the nanowires 220 exposed on the photoresist 231. Molecules having a low ionization potential such as CuPc, ZnPc, pentacene, and BEDT-TTF may be used as the n-type doping material 225. Because the n-type doping material 225 provides electrons to the surface of the corresponding nanowires 120, free electrons are formed on the surface of the portion where the n-type doping material is adsorbed. Thus, the portion becomes the n-type doped portion 126.

Figure 9:
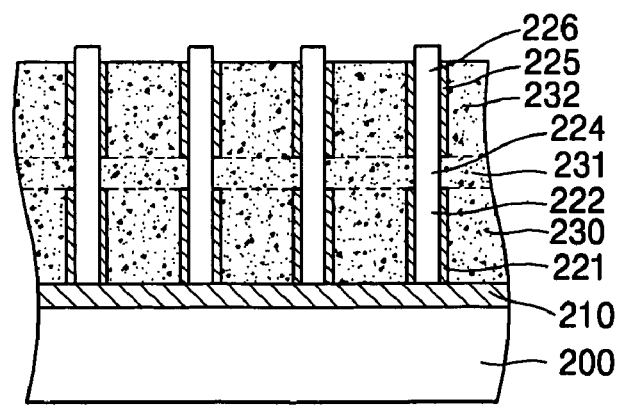

Referring to FIG. 9, a thin photoresist 232 is spin-coated and then fills the space between the nanowires 220 exposed on the photoresist 231. Next, the photoresist 232 between the nanowires 220 is selectively wet etched or removed by oxygen plasma to expose an upper edge of the n-doped portion 226.

Figure 10:
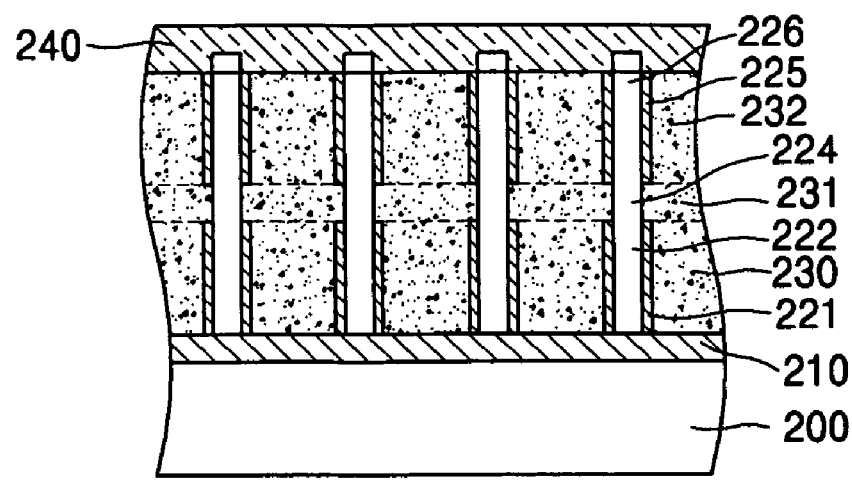

Referring to FIG. 10, a second conductive layer 240 is deposited to cover the exposed nanowires 220 on the photoresist 232.

A light emitting device fabricated by the above method has a p-i-n junction structure of FIG. 1.

A method of fabricating a light emitting device having a p-n junction structure as shown in FIG. 2 is similar to the above method except for the process of forming an intrinsic portion as shown in FIG. 7.

A nanowire light emitting device according to the present invention comprises a homogenous junction, thus having high light emitting efficiency. The device can be mass-produced because matching with a substrate is excellent. Also, the device can be directly applied to a flat display because it can be produced with a large size.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A nanowire light emitting device comprising:
   a substrate;
   a first conductive layer formed on the substrate;
   a plurality of nanowires vertically formed on the first conductive layer, each nanowire having a p-type doped portion and an n-type doped portion separately;
   a light emitting layer between the p-type doped portion and the n-type doped portion;
   a second conductive layer formed on the nanowires; and
   an insulating polymer, not containing dopant ions, filling a space between the nanowires on the first conductive layer;
   wherein the n-type doped portion includes a portion including molecules having a low ionization potential,
   wherein the p-type doped portion includes a portion including molecules having a high electron affinity,
   wherein the molecules having the high electron affinity contain fluorine,
   wherein the molecules having a low ionization potential are molecules containing at least one metal selected from the group consisting of lithium, copper, and zinc, or organic molecules.

2. The device of claim 1, wherein the light emitting layer comprises a boundary surface between the p-type doped portion and the n-type doped portion.

3. The device of claim 1,
   wherein the light emitting layer comprises an undoped intrinsic portion interposed between the p-type doped portion and the n-type doped portion.

4. The device of claim 1, wherein the molecules containing fluorine are tetrafluoro-tetracyano-quinodimethane (F4-TCNQ) molecules.

5. The device of claim 1, wherein the n-type doped portion comprises a portion where molecules having a low ionization potential are adsorbed around a circumference thereof.

6. The device of claim 1, wherein the molecules having the low ionization potential are at least one selected from the group consisting of copper phthalocyanine (CuPc), zinc phthalocyanine (ZnPc), pentacene, and bis(ethylenddithio) tetrathiafulvalene (BEDT-TTF).

7. The device of claim 1, wherein the plurality of nanowires comprises ZnO.

* * * * *